United States Patent
Wing et al.

(10) Patent No.: US 8,627,563 B2
(45) Date of Patent: Jan. 14, 2014

(54) LOW PRESSURE MOLDING ENCAPSULATION OF HIGH VOLTAGE CIRCUITRY

(75) Inventors: Kenneth E. Wing, Alpine, CA (US); Scott T. Carroll, Lakeside, CA (US)

(73) Assignee: LHV Power, Inc., Santee, CA (US)

( * ) Notice: Subject to any disclaimer, the term of this patent is extended or adjusted under 35 U.S.C. 154(b) by 1197 days.

(21) Appl. No.: 12/526,032

(22) PCT Filed: Feb. 6, 2008

(86) PCT No.: PCT/US2008/053229
§ 371 (c)(1), (2), (4) Date: Aug. 5, 2009

(87) PCT Pub. No.: WO2008/098089
PCT Pub. Date: Aug. 14, 2008

(65) Prior Publication Data
US 2010/0314792 A1    Dec. 16, 2010

Related U.S. Application Data

(60) Provisional application No. 60/899,783, filed on Feb. 6, 2007.

(51) Int. Cl.
*H05K 3/30*    (2006.01)

(52) U.S. Cl.
USPC ................. 29/841; 29/832; 29/846; 439/378; 439/620.15

(58) Field of Classification Search
USPC ............ 29/832, 837, 841, 842, 846; 439/378, 439/620.15, 620.19, 620.22, 620.24
See application file for complete search history.

(56) References Cited

U.S. PATENT DOCUMENTS

| | | | |
|---|---|---|---|
| 4,156,888 A | | 5/1979 | Takahashi |
| 4,517,895 A | * | 5/1985 | Rucker ..................... 102/202.2 |
| 5,699,231 A | * | 12/1997 | ElHatem et al. .............. 361/752 |
| 5,847,933 A | | 12/1998 | Lostumo et al. |
| 6,379,625 B1 | * | 4/2002 | Zuk, Jr. ......................... 422/535 |
| 6,821,110 B2 | * | 11/2004 | Carlson et al. ................ 425/542 |
| 2006/0189173 A1 | | 8/2006 | Negle et al. |

* cited by examiner

*Primary Examiner* — Peter DungBa Vo
*Assistant Examiner* — Jeffrey T Carley

(57) ABSTRACT

A process relating to a one step low pressure injection molding method of encapsulating high voltage circuitry while incorporating a unique recessed high voltage connector contact means within the injection molding material, greatly reducing the component size, while increasing the capabilities of this type of circuitry. The process reduces the manufacturing time and maintains a clean sealed contact point for repeated usage by the means of a conductive rubber slug. An additional advantage is by creating cavities through the circuit board; axially leaded high voltage components may be conveniently mounted without additional assembly components while being fully encapsulated.

10 Claims, 4 Drawing Sheets

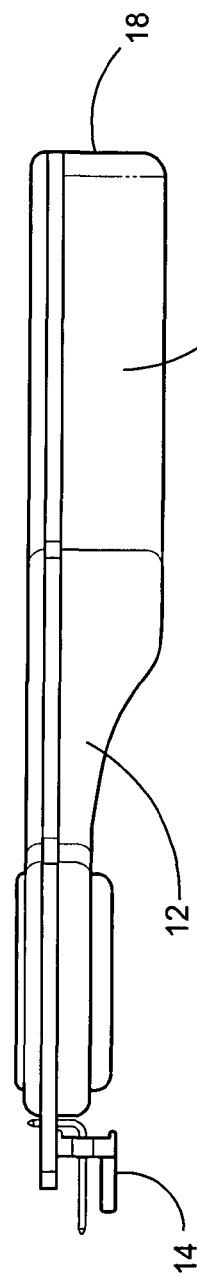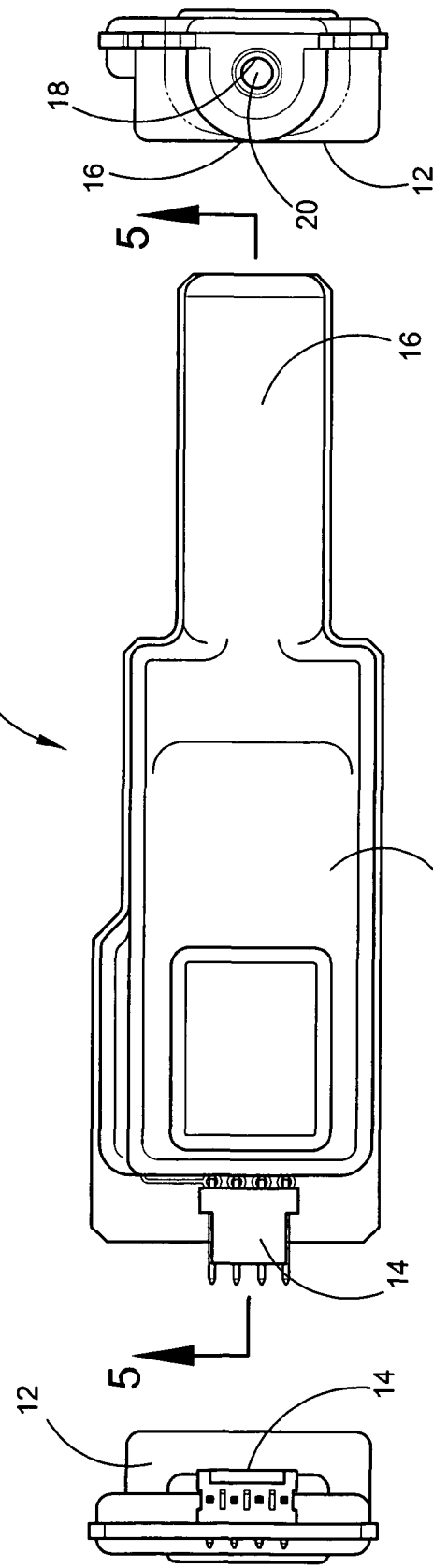

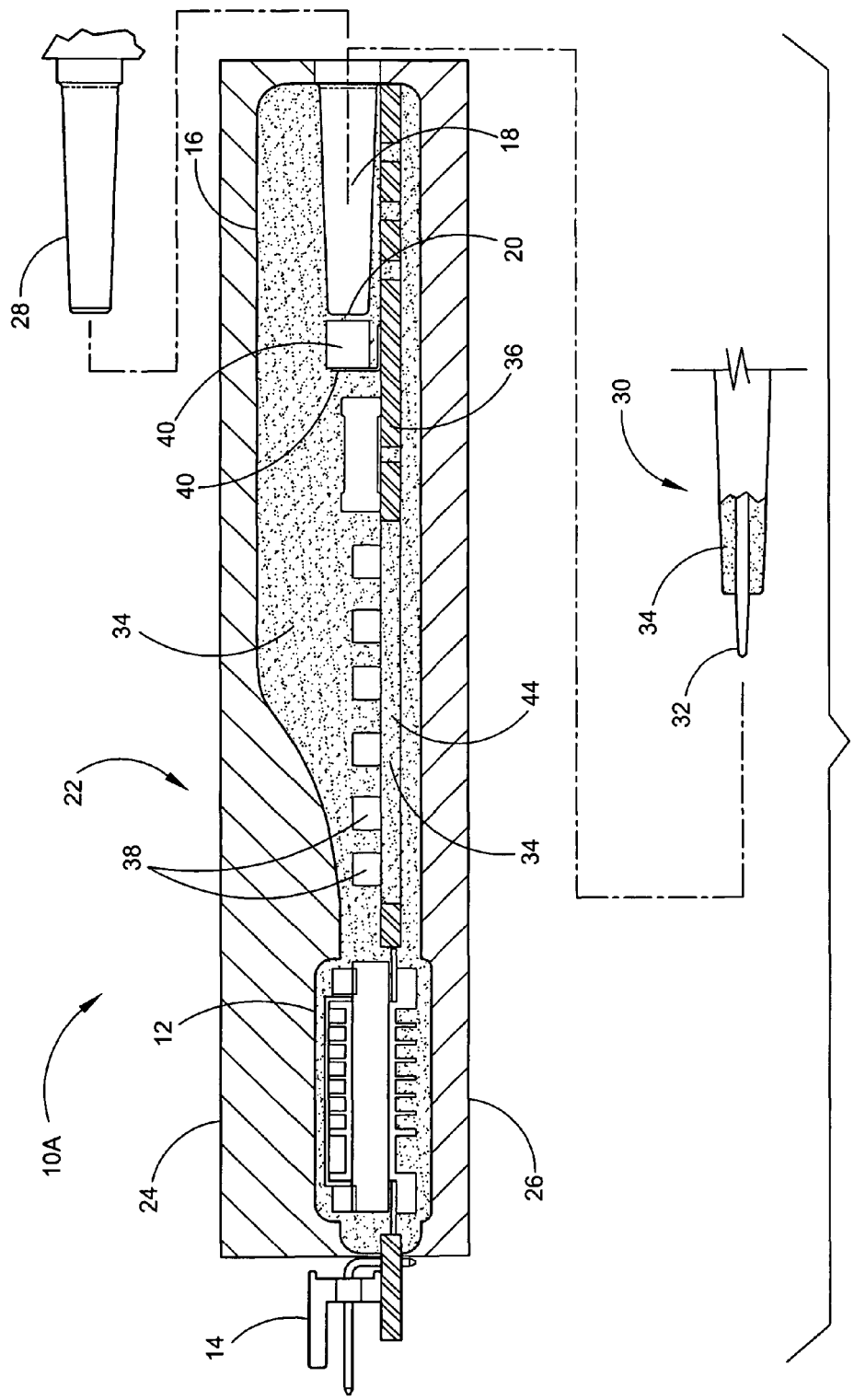

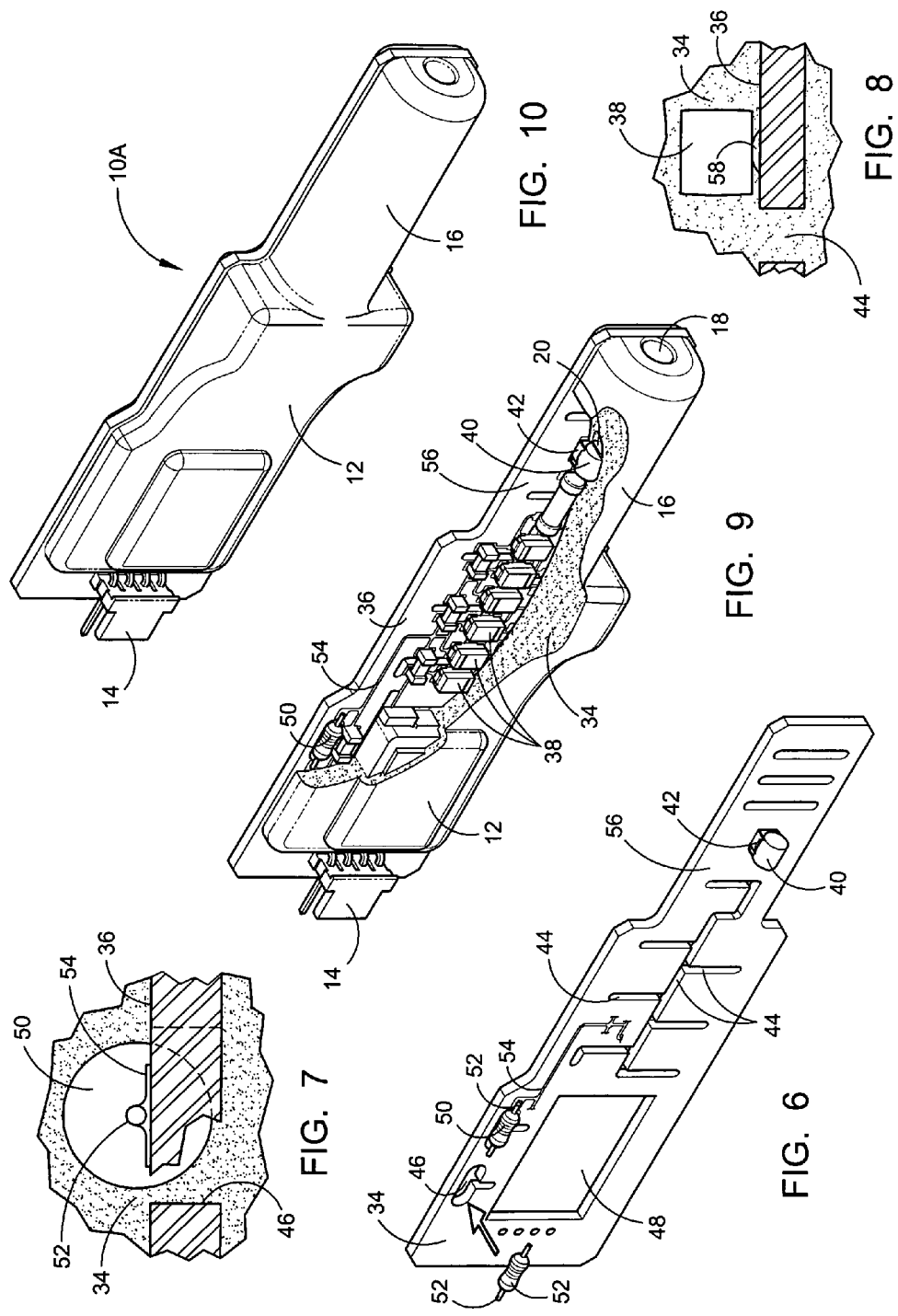

LOW PRESSURE MOLDING ENCAPSULATION OF HIGH VOLTAGE CIRCUITRY

This patent application claims the benefit of U.S. provisional patent application Ser. No. 60/899,783 filed on Feb. 6, 2007.

FIELD OF THE INVENTION

The process relates to a one step low pressure injection molding method of encapsulating high voltage circuitry while incorporating a unique integrated recessed high voltage connector contact means, greatly reducing the component size, while increasing the capabilities of this type of circuitry and connection means. The process reduces the manufacturing time and maintains a clean sealed contact point for repeated usage. An additional advantage in this process is by creating cavities through the circuit board; axially leaded high voltage components may be conveniently mounted without additional assembly components while being fully encapsulated.

BACKGROUND OF THE INVENTION

The standard technique of protecting high voltage circuitry from the environment and from internal arcing, due to the necessity to violate open air construction spacing rules while using compact construction techniques with high voltage levels, entails encapsulating the circuitry using an open potting shell or mold, pouring in liquid state epoxy or RTV rubber, vacuum de-airing the material, and then curing the assembly at room temperature for a certain period of time. This traditional method requires many steps and much time to complete, and is thus not well suited for high volume, low cost assembly of high voltage circuit boards. Therefore, it would be highly desirable to have an encapsulation technique that would entail fewer steps, be more efficient and less expensive to perform, as well as be suitable for high volume low cost assembly of high voltage circuit boards.

High voltage connections require long tracking distances and the use of insulating material to prevent corona and electron leakage from the point of connection. This is most often done by deeply recessing an open contact point at the base of a long tunnel of insulating material to form the "female" contact, with the male contact being a long conductor point insulated by an appropriate material, except at the point of connection at the bottom of the tunnel. The common terminology for this is a "poke-home connection". These connectors tend to be expensive and space consuming. Therefore, it would be highly desirable to have a connection tunnel that is integrated into the encapsulation over-molding material including a built-in contact or other typical conductive contact device, such as but not limited to, a conductive rubber slug.

The use of a conductive rubber slug to make an electrical contact is not new, however, it would be highly desirable to have a novel design which incorporates a metal "saddle" by which the slug is secured to the printed circuit board. This way, the saddle is assembled and soldered to the printed circuit board by normal surface mount assembly and soldering techniques, and the slug could then be pushed in place into the saddle by another normal assembly pick and place operation, saving time and expense. By this process the rubber slug is additionally encapsulated with a thin cross sectional area adjacent to the integrated poke-home connection tunnel creating a thin membrane surface on that side.

Often in Voltage high voltage work, surface mount components, suitable for high voltage operation, of a specific size and performance are not available, or if they are, they are dramatically more expensive than the conventional "thru-hole" counterpart. This is the case with a resistor used for high voltage regulation feedback. The use of axially leaded components with surface mount assembly techniques would normally require complex lead formation devices and special tape cavity carriers to allow for proper component alignment into the pick and place machinery prior to placement on the board. Therefore, it would be highly desirable to have a slot pre-cut into the printed circuit board where the resistor or any other axially or conventionally leaded component will mount in a recessed fashion to enable quick assembly and complete encapsulation over the component and printed circuit board.

Numerous innovations for encapsulating circuitry have been provided in the prior art that are described as follows. Even though these innovations may be suitable for the specific individual purposes to which they address, they differ from the present process as hereinafter contrasted. The following is a summary of those patents most relevant to the description at hand, as well as a description outlining the difference between the features of the present process of encapsulating high voltage circuitry with a connector contact means and those of the prior art.

U.S. Pat. No. 7,211,215 of Marcel Gerardus Antonius Tomassen et al. relates to a mold for encapsulating electronic components mounted on a carrier, comprising: of at least two mold parts displaceable relative to each other, at least one of which is provided with a recess, and feed means for encapsulating material, wherein at least one of the mold parts is provided with a runner which connects on one side to a wall of a mold part co-defining a mold cavity and connects on the other side to a side of the mold part remote from the mold cavity. The invention also relates to an encapsulating device of which such a mold forms parts, and to a method for encapsulating electronic components mounted on a carrier.

This patent describes a mold for encapsulating conventional electronic components mounted on a carrier but does not deal with the unique problems incurred with encapsulating high voltage circuitry or the incorporation of contact means within the encapsulating material or the use of a low pressure injection molding encapsulating technique.

U.S. Pat. No. 6,534,711 of Richard Stephen Pollack describes a package for encapsulating electronic components that has at least two chambers. Electronic components and modules within the chambers are interconnected by a lead frame extending between the two chambers. One chamber may surround the other chamber, or it may be adjacent the other chamber. The sidewall of one chamber may be higher than the sidewall of the other chamber. Each of the chambers may individually be filled with encapsulating material. Temporary connections to the lead frame may be made after one chamber is filled with encapsulating material, in an unfilled other chamber of the package, which is subsequently filled with encapsulating material. A portion of a lead frame may extend to the exterior of the package. Openings may be provided in an external surface of the package for making connections with external components. The electronic components may include an RF-transponder and a pressure sensor, and the package may be mounted within a pneumatic tire.

This patent describes a novel technique for packaging electronic circuit modules and components. It does not use an injection molding process or deal with the problems involved with high voltage circuitry or the innovative way of creating a slot pre-cut into the printed circuit board where the resistor or any other axially or conventionally leaded component will mount in a recessed fashion to enable quick assembly and complete encapsulation.

U.S. Pat. No. 6,531,083 of Mario A. Bolanos et al. describes a method and apparatus for encapsulating an integrated circuit die and lead frame assembly. A prepackaged sproutless mold compound insert is placed in a rectangular receptacle in a bottom mold chase. The receptacle is coupled to a plurality of die cavities by runners. Lead frame strip assemblies containing lead frames, integrated circuit dies, and bond wires coupling the lead frames and dies are placed over the bottom mold chase such that the integrated circuit dies are each centered over a bottom mold die cavity. A top mold chase is placed over the bottom mold chase and the mold compound package. The top mold chase has die cavities corresponding to those in the bottom mold chase. The mold compound insert is preferably packaged in a plastic film, which has heat sealed edges. The mold compound is forced through the package and heat seals during the molding process by the pressure applied by a rectangular plunger. The sproutless mold compound insert is packaged so that the mold compound will exit the packaging only where runners intersect the receptacle. The sproutless mold compound insert requires no alignment or cutting tools within the mold station. The plunger is applied using variable speed and pressure to control the rate the mold compound fills the cavities in the top and bottom mold chases, thereby avoiding voids in the completed packages and minimizing wire sweep of the bond wires of the integrated circuit assemblies.

This patent relates to the field of die and lead frame assembly of integrated circuits and to the encapsulation packaging using transfer-molding techniques which is a much slower process than the low pressure injection molding process and less adaptable to a rapid production. It does not incorporate the low-pressure injection molding process, the conductive rubber slug or the integrated connection tunnel.

U.S. Pat. No. 4,861,251 of Max Moitzger describes an apparatus for encapsulating selected portions of the printed circuit board in a pin grid array using transfer-molding techniques. In one embodiment for encapsulating only the top surface and side edges of the board, a vacuum is provided in the lower cavity to hold the edges of the bottom surface of the board flush against the mold plate. In a second embodiment for encapsulating all exposed surfaces of the board, the array pins are inserted in holes in the bottom of the cavity and supported by an adjustable block which positions the board in the cavity.

This patent describes an apparatus for encapsulating selected portions of conventional printed circuit boards but does not deal with the unique problems involved with a high voltage circuit board and does not include incorporating a means of connection into the encapsulation material.

None of the foregoing prior art teaches or suggests the particular unique features of encapsulating high voltage circuitry incorporating a connector contact means and thus clarifies the need for further improvements in the field of encapsulating high voltage components.

In this respect, before explaining at least one embodiment of the design in detail it is to be understood that the encapsulating high voltage circuitry incorporating a connector contact means is not limited in its application to the details of construction and to the arrangement of the components set forth in the following description or illustrated in the drawings. The process is capable of other embodiments and of being practiced and carried out in various ways. Also, it is to be understood that the phraseology and terminology employed herein are for the purpose of description and should not be regarded as limiting.

SUMMARY OF THE INVENTION

The principal advantage is to create a process of encapsulating high voltage circuitry with a unique incorporated connector contact means.

Another advantage is to use a low-pressure injection molding technique to accelerate the manufacturing process.

Another advantage is to create an integrated poke-home connection tunnel into the over-molding material used to encapsulate the high voltage circuitry, saving the cost of the connector, and the cost of mounting a separate connection means to the circuit board assembly.

Another advantage is to mount a conductive rubber slug, by the means of a metal saddle on the circuit board, covered by the over-molding material and creating a thin membrane between the conductive rubber slug and the integrated poke-home connection tunnel.

Another advantage in having a thin membrane between the conductive rubber slug and the incorporated connection poke-home tunnel is that a mating insulated "male" high voltage connector with a sharp point can easily penetrate the membrane making the shielded high voltage electrical contact required.

And still another advantage is that the opening created in the membrane will contract after the "male" high voltage connector with a sharp point is removed re-sealing the conductive rubber slug from the environment.

A further advantage is to have a slot pre-cut into the printed circuit board where the resistor or any other axially or conventionally leaded component will mount in a recessed fashion to enable quick assembly and complete encapsulation required for the high voltage assembly process.

Yet, another advantage is having the channels or slots cut into the circuit board so the encapsulation material fills the channels breaking the conduction path along the surface of the circuit board between high voltage electrical components.

And yet a further advantage is to add a new and unique high voltage, compact, easily manufactured circuit board assembly to the field of high voltage electrical components.

These together with other objects of this process, along with the various features of novelty, which characterize the encapsulating high voltage circuitry with a unique incorporated connector contact means, are pointed out with particularity in the claims annexed to and forming a part of this disclosure. For a better understanding of the process, its operating advantages and the specific objects attained by its uses, reference should be made to the accompanying drawings and descriptive matter in which there are illustrated preferred embodiments. There has thus been outlined, rather broadly, the more important features in order that the detailed description thereof that follows may be better understood, and in order that the present contribution to the art may be better appreciated. There are additional features that will be described hereinafter and which will form the subject matter of the claims appended hereto.

The preferred embodiment of the present process includes encapsulation of high voltage circuitry by the means of over molding the circuit board by a low-pressure injection molding process with the incorporation of a high voltage electrical poke-home connector contact tunnel. A unique design of the circuit board will include slots, cavities and channels cut through allowing resistors, or any other axially or conventionally leaded components to drop down into the board and the leads of the part rest on the solder coated pads at each end of the part. Before taping the part on a reel for automatic insertion, a lead forming machine cuts the leads of the axial part short, to 0.1" long on each end. Then the part is placed by the lead cutting machine onto a tape reel. The circuit board is screened with solder paste, and then the axial part is placed into the holes by the pick and place machine. The leads rest on the two solder coated pads, and the unit is placed in a re-flow oven to melt the solder and complete the joint of wires to pads, along with all the other components that have been inserted. Channels cut in the circuit boards are centered on the high voltage electrical components allowing the injection molding resin to fully migrate into the slot and channels encapsulating the components, even the bottom against the board, which is necessary in order to break up a potential conduction path along the surface of the board or the surface of the component between the mounting pads. The unique channel design allows that the high voltage components can be arranged closer together, reducing the required size and making a more compact sealed unit.

The printed circuit board is placed into a mold designed specifically for it, and, using resin beads and an injection molding machine designed for the low pressure molding resin, the board is over-molded in one manufacturing step. The resultant unit is a device that is fully protected from the environment, and also, by the use of the proper circuit board design techniques, the high voltage components inside are fully encapsulated and insulated from each other, preventing internal arcing that would damage the parts while also providing the ability to have a smaller more compact device.

A high voltage electrical tapered poke-home connection tunnel has been designed into the over-molding material used to encapsulate the high voltage circuitry, saving the cost of the connector, and the cost of mounting the connector to the circuit board assembly. The mold has a tapered slide plug, which is retracted after molding and the deep tapered recess tunnel is formed directly into the over-mold structure covering the circuit board.

A conductive rubber slug will be secured to the circuit board by the means of a metal saddle attached to the circuit board in the conventional soldering technique. The conductive rubber slug is then pushed in place onto the saddle by another normal assembly pick and place operation. The innovation here is the mounting of the conductive rubber slug to a surface mount circuit board by conventional machines and techniques, saving special assembly cost and time.

The over-molding process produces a thin membrane layer of the injection molding material over the contact surface of the conductive rubber contact slug adjacent to the base of the integrated high voltage poke-home connector tunnel. This thin membrane serves to protect the slug surface from the environment during storage and further assembly processing and serves to prevent air contact after assembly. The "male" high voltage connector contact is formed with a sharp point, so that when the male and female portions of the connector are brought into place in the overall device assembly, the male contact can pierce the membrane, and then imbed into the conductive rubber slug. This membrane serves to reduce air contact to the slug and the male contact in this operation, thus reducing the opportunity for damaging corona or electrical leakage to occur. The opening created in the membrane will contract after the "male" high voltage connector with a sharp point is removed re-sealing the conductive rubber slug from the environment.

An alternate embodiment of encapsulating high voltage circuitry incorporating a connector contact means will have the metal saddle, conductive rubber slug contact and the integrated high voltage poke-home connector tunnel located on the opposite side of the circuit board. This design will shorten the overall length of the unit and reduce the amount of injection molding material required.

With respect to the above description then, it is to be realized that the optimum dimensional relationships for the parts of the process of encapsulating high voltage circuitry incorporating a connector contact means, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present description. Therefore, the foregoing is considered as illustrative only of the principles of the process. Further, since numerous modifications and changes will readily occur to those skilled in the art, it is not desired to limit the design to the exact construction and operation shown and described, and accordingly, all suitable modifications and equivalents may be resorted to, falling within the scope of the design.

BRIEF DESCRIPTION OF THE DRAWINGS

The accompanying drawings, which are incorporated in and form a part of this specification, illustrate embodiments of the encapsulated high voltage circuit board incorporating the connector tunnel and together with the description, serve to explain the principles of this invention.

FIG. 1 depicts a top view of a typical encapsulated high voltage circuit board incorporating the connector contact means.

FIG. 2 depicts an end view of a typical encapsulated high voltage circuit board incorporating the connector contact means 10A illustrating the external electrical connector 14 and the main body section 12.

FIG. 3 depicts a side view of a typical encapsulated high voltage circuit board incorporating the connector contact means 10A having the main body section 12 and the extended tunnel end 16.

FIG. 4 depicts an end view of a typical encapsulated high voltage circuit board incorporating the connector contact means 10A; illustrating the main body section 12, the extended tunnel end 16, and the tapered "poke-home" connection tunnel 18 with the thin membrane 20 of the injection molding material 34.

FIG. 5 depicts a cross section of a typical encapsulated high voltage circuit board 36 incorporating the connector contact means 10A with a conventional mold housing 22 consisting of a top half 24 and a bottom half 26. A tapered tunnel plug 28 that creates the tapered "poke-home connection" tunnel 18 is shown above. The male high voltage connector 30 is shown below with a partial cross section exposing the pointed needle contact end 32. The stipple represents the injection molding material 34; covering the circuit board 36, the electrical components 38, the conductive rubber slug 40 that is held in place by the metal saddle 42 and creating the thin membrane 20 between the conductive rubber slug 40 and tapered "poke-home connection" tunnel 18. A channel 44 cut through the circuit board 36 fills with the injection molding material 34 to aide in the encapsulation of the electrical components 38.

FIG. 6 depicts a perspective view of the high voltage circuit board 36 illustrating the pre-cut slots 46, cavities 48 and channels 44 enabling the unique installation of high voltage components while achieving complete coverage and isolation by the encapsulating injection molding material 34. One high voltage axially leaded resistor 50 is moved away from the circuit board 36 while a second is positioned within the pre cut slot 46 with the leads 52 resting on a segment of the printed solder circuitry 54. The conductive rubber slug 40 with the metal saddle 42 is shown attached on the extended end of the circuit board 56.

FIG. 7 depicts a cross section of a portion of a circuit board 36 illustrating the location in the pre-cut slot 46 and the high voltage axially leaded resistor 50 and the encapsulating material 34.

FIG. 8 depicts a cross section of a portion of a circuit board illustrating the location of high voltage electrical component raised off the board by the means of a bead of epoxy and covered with the encapsulating material.

FIG. 9 depicts a perspective view a typical encapsulated high voltage circuit board incorporating the connector contact 10A with a portion of the injection molding material 34 removed further illustrating the number of high voltage electrical components 38 attached to the circuit board 36 and the location of the conductive rubber slug 40 in relation to the thin membrane 20 and the tapered poke-home connection tunnel 18.

FIG. 10 depicts a perspective view of a typical encapsulated high voltage circuit board incorporating the connector contact means.

DETAILED DESCRIPTION OF THE PREFERRED EMBODIMENTS

Figure 11:
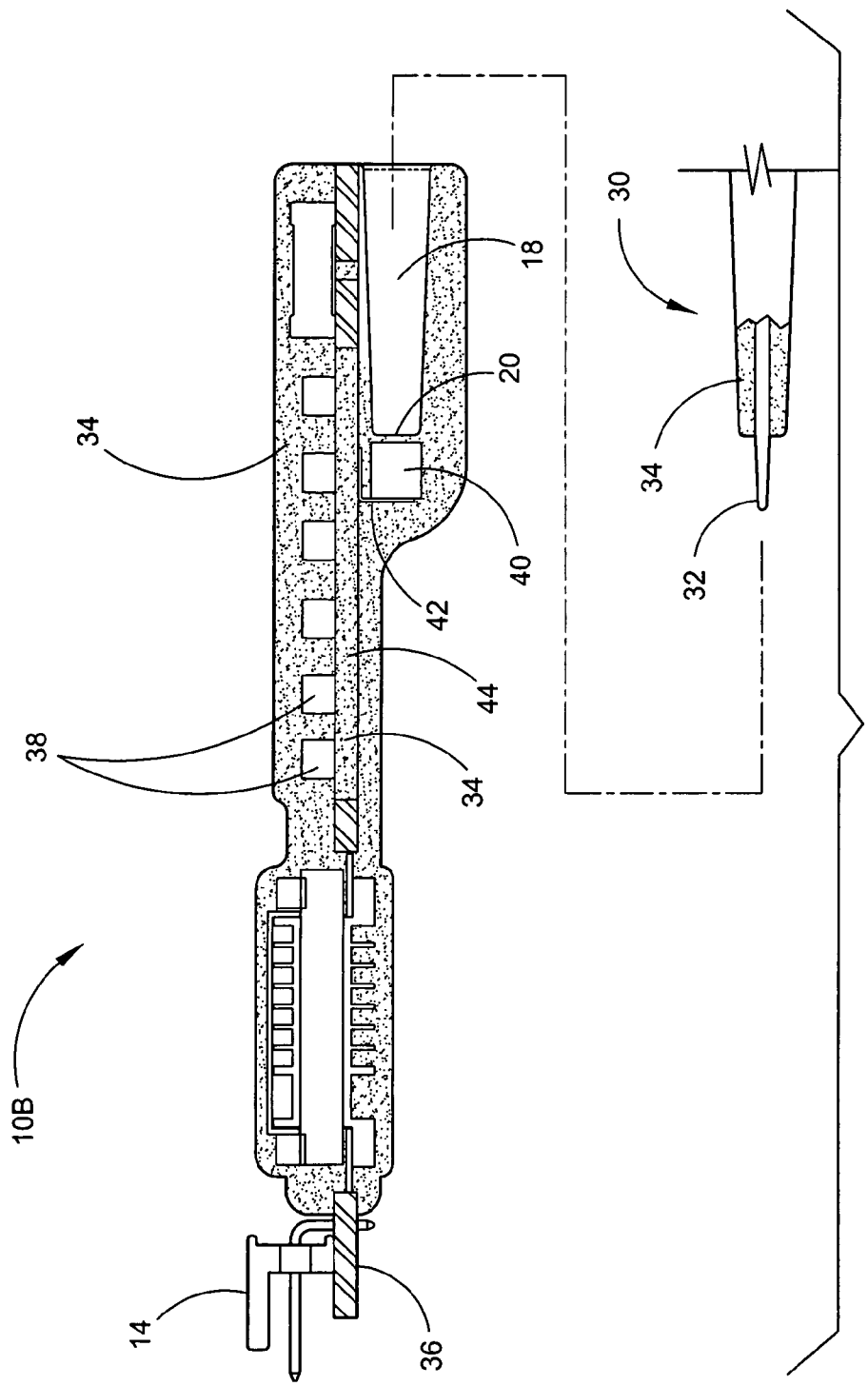
FIG. 11 depicts an alternate embodiment of the encapsulated high voltage circuit board incorporating the connector contact means with the conductive rubber slug, metal saddle and the tapered "poke-home connection" tunnel on the opposite side of the circuit board.

Referring now to the drawings, wherein similar parts of the process are identified by like reference numerals, there is seen in FIG. 1 a top view of a typical encapsulated high voltage circuit board incorporating the connector contact means 10A where the main body section 12 is shown with the external electrical connector 14 on the left. On the right of the main body section 12 is the extended tunnel end 16 with the tapered poke-home connection tunnel 18.

FIG. 2 depicts an end view of a typical encapsulated high voltage circuit board incorporating the connector contact means 10A illustrating the external electrical connector 14 and the main body section 12. FIG. 3 depicts a side view of a typical encapsulated high voltage circuit board incorporating the connector contact means 10A having the main body section 12 and the extended tunnel end 16. FIG. 4 depicts an end view of a typical encapsulated high voltage circuit board incorporating the connector contact means 10A; illustrating the main body section 12, the extended tunnel end 16, the tapered "poke-home" connection tunnel 18 with the thin membrane 20 of the injection molding material 34.

FIG. 5 depicts a cross section of a typical encapsulated high voltage circuit board incorporating the connector contact means 10A with a conventional mold housing 22 consisting of a top half 24 and a bottom half 26. A tapered tunnel plug 28 that creates the tapered "poke-home connection" tunnel 18 is shown above. The male high voltage connector 30 is shown below with a partial cross section exposing the pointed needle contact end 32. The stipple represents the injection molding material 34; covering the circuit board 36, the electrical components 38, the conductive rubber slug 40 that is held in place by the metal saddle 42 and creating the thin membrane 20 between the conductive rubber slug 40 and tapered "poke-home connection" tunnel 18. A channel 44 cut through the circuit board 36 fills with the injection molding material 34 to aide in the encapsulation of the electrical components 38.

FIG. 6 depicts a perspective view of the high voltage circuit board 36 illustrating the pre-cut slots 46, cavities 48 and channels 44 enabling the unique installation of high voltage components while achieving complete coverage and isolation by the encapsulating materials 34. One high voltage axially leaded resistor 50 is moved away from the circuit board 36 while a second is positioned within the pre cut slot 46 with the leads 52 resting on a segment of the printed solder circuitry 54. The conductive rubber slug 40 with the metal saddle 42 is shown attached on the extended end of the circuit board 56.

FIG. 7 depicts a cross section of a portion of a circuit board 36 illustrating the location in the pre-cut slot 46 and the high voltage axially leaded resistor 50 and the encapsulating material. FIG. 8 depicts a cross section of a portion of a circuit board 36 illustrating the location of high voltage electrical component 38 raised off the board by the means of a bead of epoxy 58 and covered with the encapsulating material 34 adjacent to one of the pre-cut channels 44 separating the electrical components 38.

FIG. 9 depicts a perspective view a typical encapsulated high voltage circuit board incorporating the connector contact 10A with a portion of the injection molding material 34 removed further illustrating the number of high voltage electrical components 38 attached to the circuit board 36 and the location of the conductive rubber slug 49 in relation to the thin membrane 20 and the tapered poke-home connection tunnel 18. FIG. 10 depicts a perspective view of a typical encapsulated high voltage circuit board incorporating the connector contact 10A.

FIG. 11 depicts an alternate embodiment of the encapsulated high voltage circuit board incorporating the connector contact 10B with the conductive rubber slug 40, metal saddle 42 and the tapered poke-home connection tunnel 18 on the opposite side of the circuit board 36. With this design, the unit can be shortened and less of the injection molding material 34 would be required.

The process of encapsulating high voltage circuitry incorporating a connector contact means 10A and 10B shown in the drawings and described in detail herein disclose arrangements of elements of particular construction and configuration for illustrating preferred embodiments of structure and method of operation of the present invention. It is to be understood, however, that elements of different construction and configuration and other arrangements thereof, other than those illustrated and described may be employed for providing this unique process in accordance with the spirit of this invention, and such changes, alternations and modifications as would occur to those skilled in the art are considered to be within the scope of this invention as broadly defined in the appended claims.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

We claim:
1. A process for making an over-molded PCB with an integrated poke-home connector, comprising the steps of:
   providing a printed circuit board (PCB);
   cutting a plurality of openings in said. PCB;
   providing a plurality of components;

mounting said plurality of components in said plurality of openings;

encapsulating said components and said PCB by means of a low pressure injection molding;

providing an integrated poke-home connector comprising: a recessed high voltage connector contact affixed to said PCB, said recessed high voltage connector contact having a conductive rubber slug and a thin membrane over said conductive rubber slug;

providing a metal saddle electrically connected to the PCB; and wherein said conductive rubber plug is electrically connected to said metal saddle.

2. The process for making an over-molded PCB with an integrated poke-home connector according to claim 1, wherein said recessed high voltage connector contact forms an arc resistant connection point.

3. The process for making an over-molded PCB with an integrated poke-home connector according to claim 2, further comprising the step of:

providing said thin membrane over said recessed conductive rubber slug which may be pierced by an insulated "male" high voltage connector with a sharp point to complete an electrical connection.

4. The process for making an over-molded PCB with an integrated poke-home connector according to claim 2, further comprising the step of:

providing said thin membrane over said recessed conductive rubber slug which is a self-resealing membrane once said insulated "male" high voltage connector with a sharp point is removed.

5. The process for making an over-molded PCB with an integrated poke-home connector according to claim 1, wherein said openings further comprise slots further comprising the steps of:

providing axially mounted components; and mounting said axially mounted in said slots.

6. The process for making an over-molded PCB with an integrated poke-borne connector according to claim 1, wherein said openings further comprise cavities further comprising the steps of:

providing large surface area components; and mounting said large surface area components in said cavities.

7. The process for making an over-molded PCB with an integrated poke-home connector according to claim 1, further comprising the step of: cutting channels into said PCB to isolate said plurality of components.

8. The process for making an over-molded PCB with an integrated poke-home connector according to claim 7, further comprising the step of:

injecting low-pressure mold encapsulation material in said channels to break conductivity pathways between said plurality of components.

9. The process for making an over-molded PCB with an integrated poke-home connector according to claim 1, further comprising the step of:

providing at least one of said plurality of components to be a high voltage component.

10. The process for making an over-molded PCB with an integrated poke-home connector according to claim 1, further comprising the step of: providing at least one of said plurality of components for their use in current mode (CM) output control of the high voltage output curve slope.

* * * * *